United States Patent
Lee et al.

(10) Patent No.: US 7,880,286 B2
(45) Date of Patent: *__Feb. 1, 2011__

(54) TAPE WIRING SUBSTRATE AND CHIP-ON-FILM PACKAGE USING THE SAME

(75) Inventors: Si-Hoon Lee, Yongin-si (KR); Eun-Seok Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/222,986

(22) Filed: Aug. 21, 2008

(65) Prior Publication Data

US 2008/0315437 A1     Dec. 25, 2008

Related U.S. Application Data

(63) Continuation of application No. 11/362,882, filed on Feb. 28, 2006, now Pat. No. 7,420,270.

(30) Foreign Application Priority Data

Jul. 18, 2005   (KR)   ................................ 2005-64789

(51) Int. Cl.
*H01L 23/52*   (2006.01)
(52) U.S. Cl. .................. 257/691; 257/693; 257/778; 257/701; 257/702; 257/E23.055; 257/E23.079; 257/E21.503; 257/E21.511
(58) Field of Classification Search ................ 257/691, 257/701, 702, 778, E29.039, E23.055, E23.065, 257/E23.067, E23.079, E21.503, E21.511, 257/E23.034, E23.035, E23.036, E23.037, 257/E23.038, E23.039; 174/250; 428/209
See application file for complete search history.

(56) References Cited

U.S. PATENT DOCUMENTS 6,642,611 B2 * 11/2003 Iwasaki ...................... 257/679

(Continued)

FOREIGN PATENT DOCUMENTS

| JP | 07-094555 | 4/1995 |
| JP | 2001-102406 | 4/2001 |
| KR | 10-2003-0037168 | 5/2003 |

OTHER PUBLICATIONS

Notice of Second Office Action dated May 8, 2009 for counterpart Chinese Application No. 2006100678640 and English translation thereof.

(Continued)

*Primary Examiner*—Jasmine J Clark
(74) *Attorney, Agent, or Firm*—Harness, Dickey & Pierce, P.L.C.

(57) ABSTRACT

A chip-on-film package may include a tape wiring substrate, a semiconductor chip mounted on the tape wiring substrate, and a molding compound provided between the semiconductor chip and the tape wiring substrate. The tape wiring substrate may include a film having upper and lower surfaces. Vias may penetrate the film. An upper metal layer may be provided on the upper surface of the film and include input terminal patterns and/or output terminal patterns. The input terminal patterns may include ground terminal patterns and/or power terminal patterns. A lower metal layer may be provided on the lower surface of the film and include a ground layer and/or a power layer. The ground layer and the power layer may cover at least a chip mounting area.

26 Claims, 10 Drawing Sheets

U.S. PATENT DOCUMENTS

| | | |
|---|---|---|
| 6,864,119 B2 | 3/2005 | Seko .......................... 438/106 |
| 7,253,503 B1 * | 8/2007 | Fusaro et al. ............... 257/668 |
| 7,420,270 B2 * | 9/2008 | Lee et al. .................... 257/691 |
| 2003/0058230 A1 | 3/2003 | Ide ............................. 345/204 |
| 2004/0145052 A1 | 7/2004 | Ueno et al. ................. 257/734 |
| 2005/0023147 A1 | 2/2005 | Hashimoto ................. 205/122 |
| 2005/0093114 A1 | 5/2005 | Son et al. .................... 257/668 |
| 2005/0218512 A1 | 10/2005 | Egawa et al. ................ 257/734 |
| 2007/0094872 A1 | 5/2007 | Konishi et al. ............... 29/840 |

OTHER PUBLICATIONS

Office Action dated Oct. 17, 2008 for counterpart Chinese Application No. 2006100678640.

* cited by examiner

TAPE WIRING SUBSTRATE AND CHIP-ON-FILM PACKAGE USING THE SAME

PRIORITY STATEMENT

This U.S. non-provisional application is a continuation of, and claims priority under 35 U.S.C. §120 to, U.S. application Ser. No. 11/362,882, filed Feb. 28, 2006, now U.S. Pat. No. 7,420,270, which claims benefit of priority under 35 U.S.C. §119 from Korean Patent Application No. 2005-64789, filed on Jul. 18, 2005, the entire contents of each of which are incorporated herein by reference.

BACKGROUND

1. Field of the Invention

Example embodiments of the present invention relate in general to a tape wiring substrate and a tape package using the tape wiring substrate and, more particularly, to a tape wiring substrate that may have a dual metal layer and a chip-on-film package that may implement the tape wiring substrate.

2. Description of the Related Art

Flat panel displays may include, for example, a liquid crystal display ("LCD") for portable phones, a thin-film transistor liquid crystal display ("TFT LCD") for computers and plasma display panels ("PDP") for domestic use. A flat panel display may include a component part known in the art as a tape package. In some applications, the tape package may have fine pitch wiring patterns.

Tape packages may include a tape wiring substrate. The two principal types of tape packages may be a tape carrier package ("TCP") and a chip on film ("COF") package. The tape wiring substrate of a TCP may have a chip mounting window in which a semiconductor chip may be mounted via an inner lead bonding method (for example). The tape wiring substrate of a COF package may not include a chip mounting window. Here, the semiconductor chip may be flip chip bonded to the tape wiring substrate. As compared to the TCPs, the COF packages may allow a thinner tape wiring substrate and/or finer pitch wiring patterns.

In the COF packages, I/O terminal patterns may act as external connection terminals, instead of solder bumps. The I/O terminal patterns may be directly attached to a printed circuit board or a display panel.

FIG. 1 is a plan view of a conventional COF package 100. FIG. 2 is a cross-sectional view taken along the line II-II of FIG. 1.

Referring to FIGS. 1 and 2, the COF package 100 may include a tape wiring substrate 20. A semiconductor chip 10 may be flip chip bonded to the tape wiring substrate 20. A molding compound 40 may seal the flip chip bonded portion through an underfill process.

The semiconductor chip 10 may have an active surface that may support electrode pads 12. The electrode pads 12 may be provided along the edge portions of the active surface. Electrode bumps 16 may be provided on the electrode pads 12. The electrode bumps 16 may include input bumps 17 and output bumps 18, for example. The input bumps 17 may include ground bumps 17a and power bumps 17b, for example.

The tape wiring substrate 20 may include a base film 21, and an upper metal layer 24 provided on the upper surface 22 of the base film 21. The base film 21 may have a chip mounting area confronting the semiconductor chip 10. The chip mounting are may be located in the center portion of the base film 21. The base film 21 may include sprocket holes 29. The sprocket holes 29 may be arranged along the base film 21 at predetermined intervals. An end of the upper metal layer 24 may be connected to the electrode bumps 16. Another end of the upper metal layer 24 may extend outwards from the chip mounting area. The upper metal layer 24 may include input terminal patterns 25 and output terminal patterns 26. The input terminal patterns 25 may include input terminal patterns for ground 25a ("ground terminal patterns") and input terminal patterns for power 25b ("power terminal patterns"). The input terminal patterns 25 may extend to one side of the base film 21 relative to the semiconductor chip 10, and the output terminal patterns 26 may extend to another side of the base film 21 relative to the semiconductor chip 10. The input and the output terminal patterns 25 and 26 may extend parallel to the arrangement of the sprocket holes 29.

When the semiconductor chip 10 is flip chip bonded to the tape wiring substrate 20, the ground bumps 17a may be bonded to the ground terminal patterns 25a and the power bumps 17b may be bonded to the power terminal patterns 25b.

Although conventional COF packages are generally thought to be acceptable, they are not without shortcomings. For example, to facilitate achievement of semiconductor products having lighter weight, smaller size, higher speed, multifunction and/or increased performance, the upper metal layer 24 may have fine pitch wiring patterns, the semiconductor chip 10 may be more miniaturized, and the number of electrode bumps 16 may be increased. Accordingly, the ground terminal patterns 25a and the power terminal patterns 25b may be reduced in pitch. The ground and the power terminal patterns 25a and 25b provided on the upper surface 22 of the base film 21 may have insufficient areas for stable ground and/or power supply, for example.

The conventional COF package 100 may insufficiently reduce electromagnetic waves and/or noise that may occur during operation of the semiconductor chip 10, which may result in poor electromagnetic interference and/or noise characteristics. Further, the conventional COF package 100 may unstably supply power to the semiconductor chip 10.

SUMMARY

According to an example, non-limiting embodiment, a tape wiring substrate may include a film having an upper surface including a chip mounting area, a lower surface, and vias penetrating the film. An upper metal layer may be provided on the upper surface of the film and connected to electrode bumps of a semiconductor chip. The upper metal layer may include input terminal patterns and output terminal patterns. The upper metal layer may extend only onto an outer peripheral region of the chip mounting area. A lower metal layer may be provided on the lower surface of the film. The lower metal layer including a ground layer.

According to another example, non-limiting embodiment, a package may include a semiconductor chip having an active surface with electrode bumps. A tape wiring substrate may be provided on which the semiconductor chip is mounted such that the electrode bumps may face the tape wiring substrate. A molding compound may be provided between the semiconductor chip and the tape wiring substrate. The tape wiring substrate may include a film having an upper surface including a chip mounting area, a lower surface, and vias penetrating the film. An upper metal layer may be provided on the upper surface of the film and connected to the electrode bumps. The upper metal layer may include input terminal patterns and output terminal patterns. The upper metal layer may extend only onto an outer peripheral region of the chip mounting area. A lower metal layer may be provided on the lower surface of the film. The lower metal layer may include a ground layer.

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

The drawings are for illustrative purposes only and are not drawn to scale. The spatial relationships and relative sizing of the elements illustrated in the various embodiments may have been reduced, expanded and/or rearranged to improve the clarity of the figures with respect to the corresponding description. The figures, therefore, should not be interpreted as accurately reflecting the relative sizing and/or positioning of the corresponding structural elements that could be encompassed by an actual device manufactured according to the example, non-limiting embodiments of the invention.

DETAILED DESCRIPTION OF EXAMPLE NON-LIMITING EMBODIMENTS

Example, non-limiting embodiments of the present invention will be described more fully with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Well-known structures and processes are not described or illustrated in detail to avoid obscuring the present invention.

Figure 1:
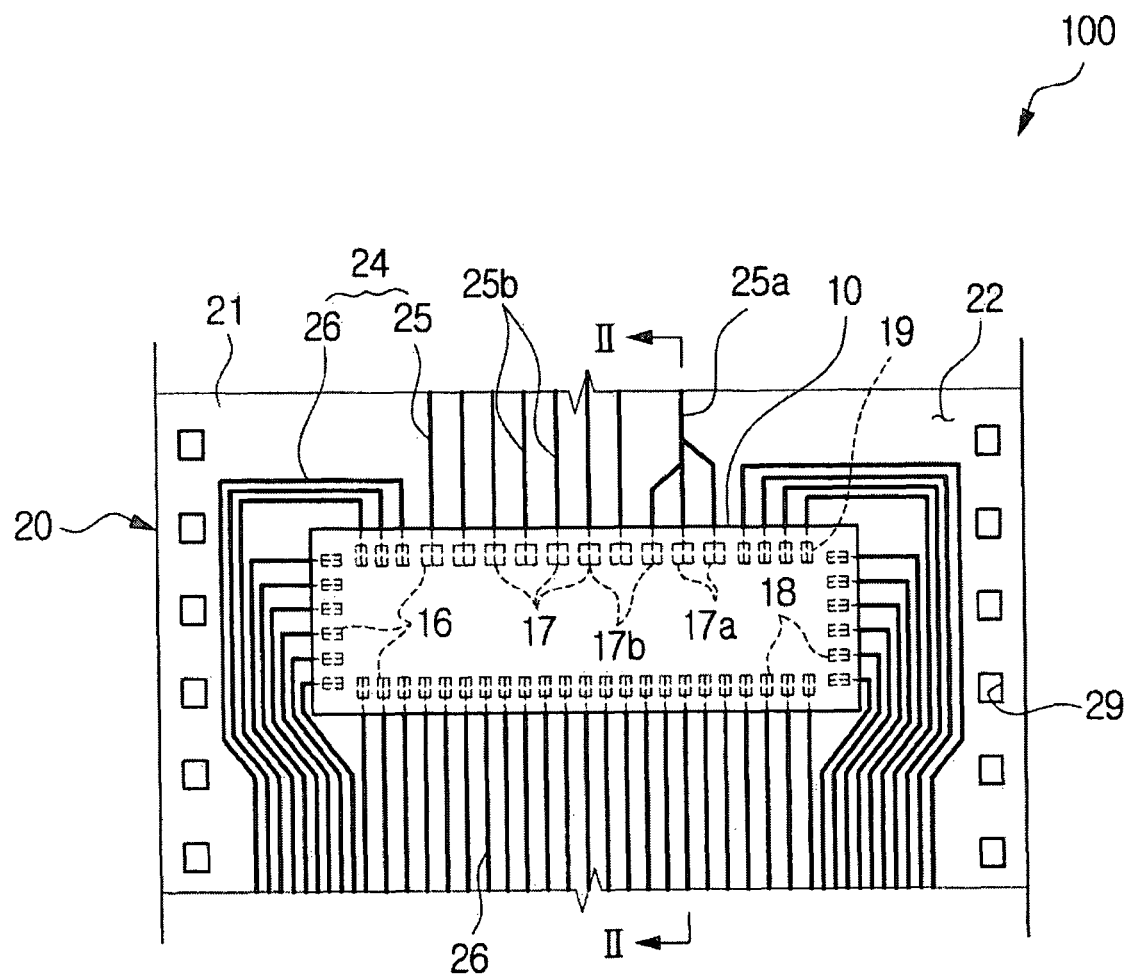
FIG. 1 is a plan view of a conventional COF package.
Figure 2:
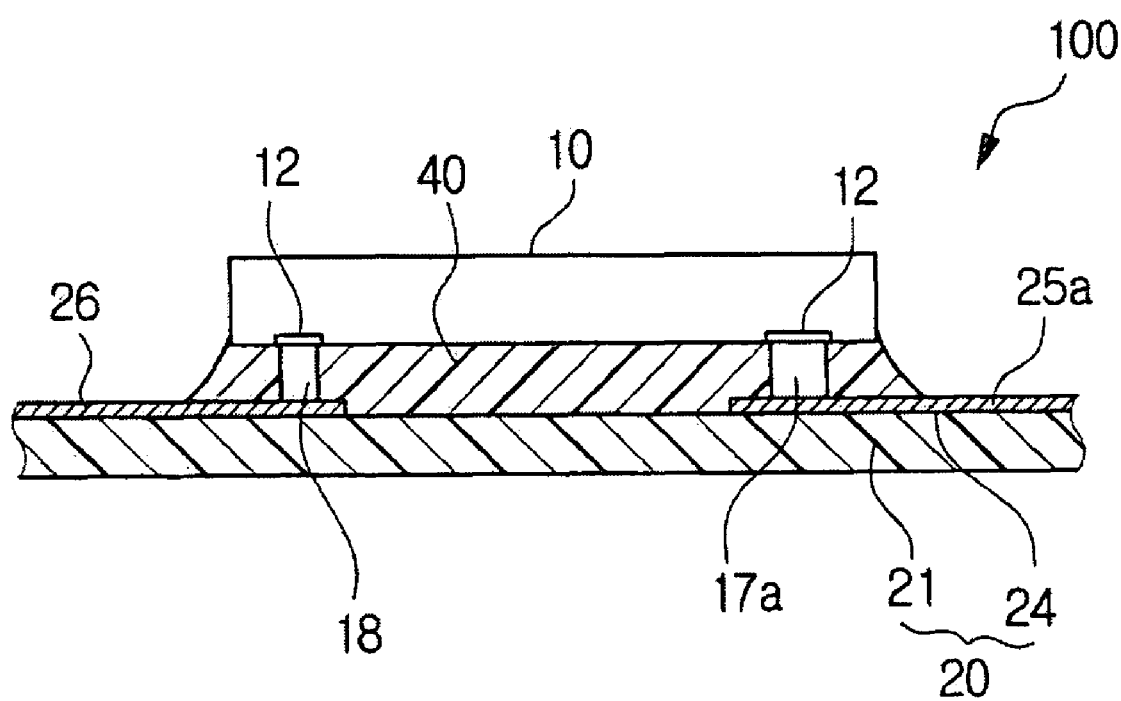
FIG. 2 is a cross-sectional view taken along the line II-II of FIG. 1.
Figure 3:
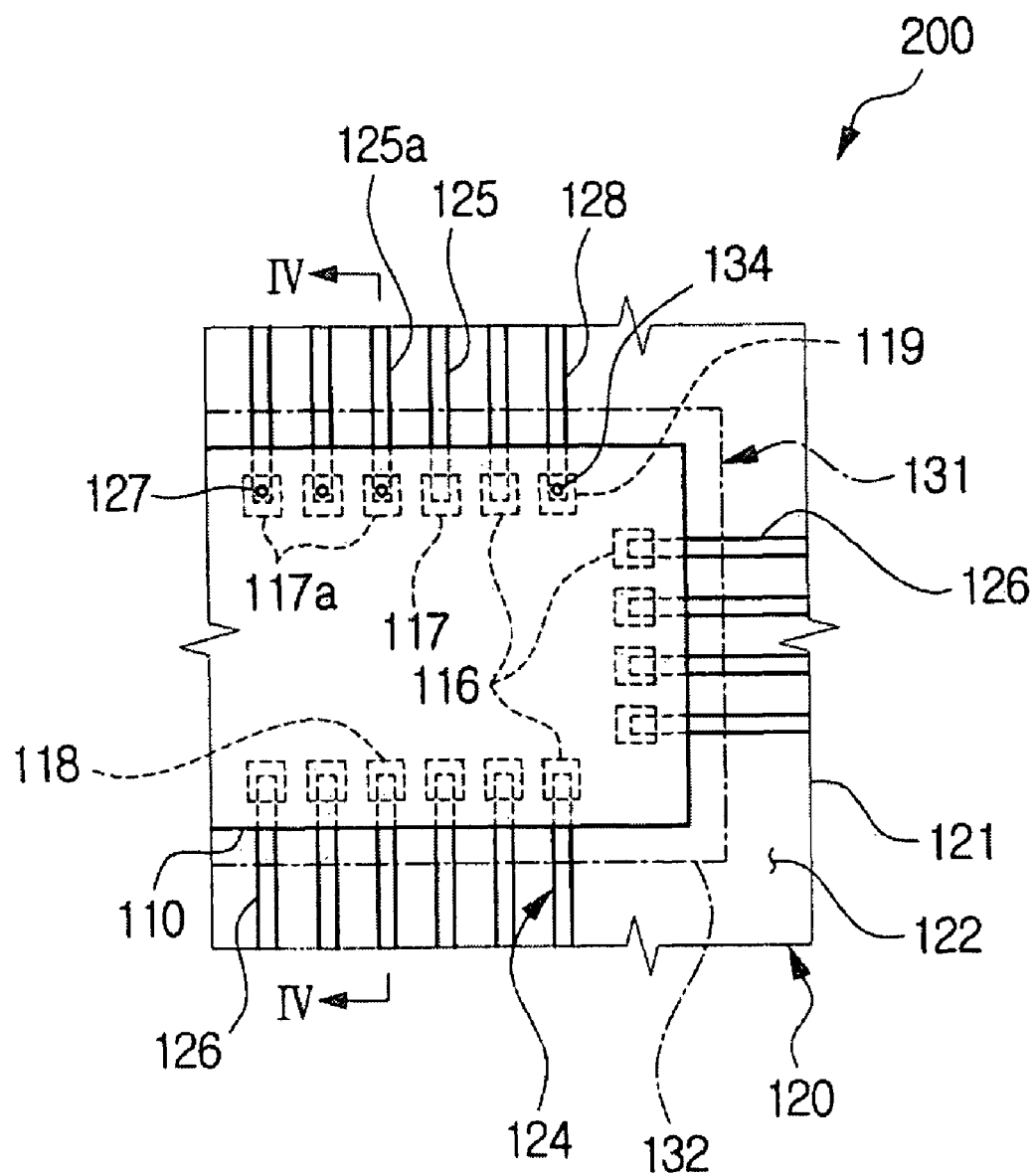
FIG. 3 is a plan view of a COF package in accordance with an example, non-limiting embodiment of the present invention.
Figure 4:
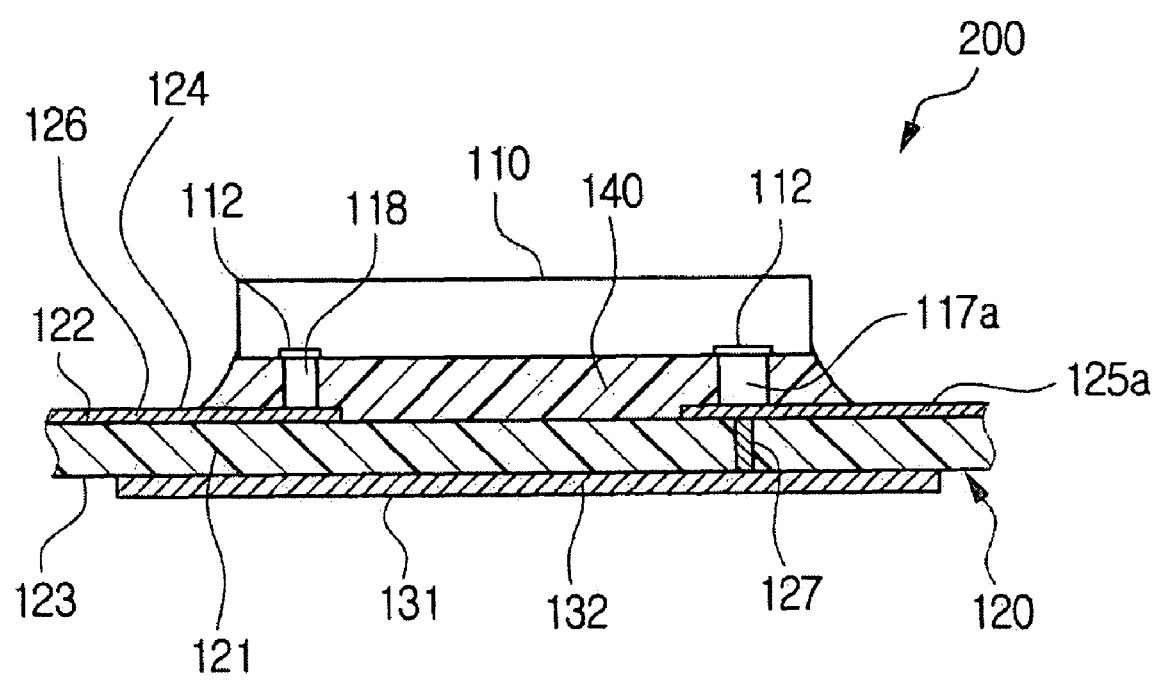
FIG. 4 is a cross-sectional view taken along the line IV-IV of FIG. 3.
Figure 5:
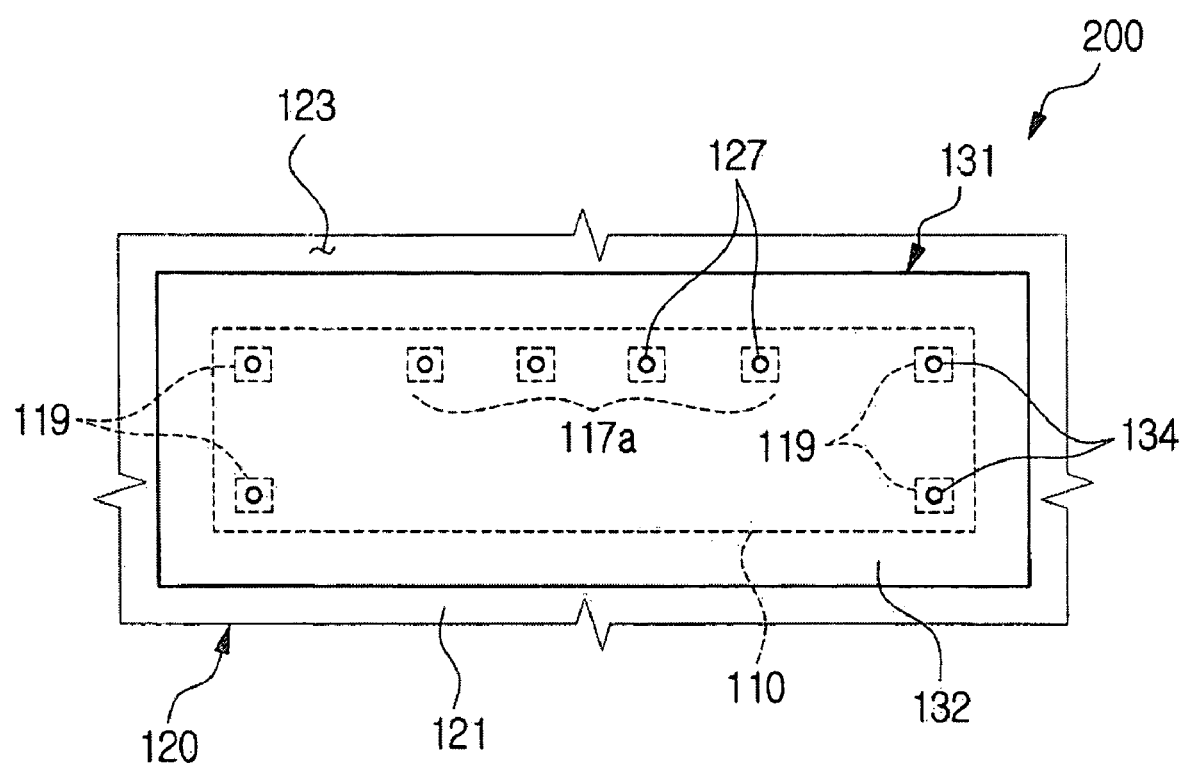
FIG. 5 is a bottom view of a COF package in accordance with an example, non-limiting embodiment of the present invention.

FIG. 3 is a plan view of a COF package 200 in accordance with an example, non-limiting embodiment of the present invention. FIG 4 is a cross-sectional view taken along the line IV-IV of FIG. 3. FIG. 5 is a bottom view of the COF package 200 in accordance with an example, non-limiting embodiment of the present invention.

Referring to FIGS. 3 through 5, the COF package 200 may include a tape wiring substrate 120 and semiconductor chip 110. The tape wiring substrate 120 may have a dual metal layer 124 and 131. The semiconductor chip 110 may be flip chip bonded to the tape wiring substrate 120. A molding compound 140 may seal the flip chip bonded portion. The molding compound may be provided via an underfill process, for example.

The semiconductor chip 110 may have an active surface with electrode pads 112. The electrode pads 112 may be provided along the periphery of the active surface. Electrode bumps 116 may be provided on the electrode pads 112. The electrode bumps 116 may include input bumps 117 and output bumps 118, for example. The input bumps 117 may include ground bumps 117a and power bumps (not shown), for example. The input bumps 117 may be larger in size and/or pitch than the output bumps 118. This may reduce fault likelihood which may occur (for example) due to static electricity between the input bumps 117. The semiconductor chip 110 may include dummy bumps 119. The dummy bumps 119 may be provided at the corner regions of the active surface, for example. The dummy bumps 119 may improve assembly stability and/or heat radiation, for example.

The tape wiring substrate 120 may include a base film 121. The base film 121 may be fabricated from polyimide, for example. The base film 121 may be fabricated from numerous other materials that are well known in this art. The dual metal layer 124 and 131 may be fabricated from Cu foiled on the base film 121, for example. The dual metal layers 124 and 131 may be fabricated from numerous materials (other than Cu) and using numerous techniques (other than foiling) that are well known in this art. The base film 121 may have an upper surface 122 including a chip mounting area, and a lower surface 123 opposite to the upper surface 122. The chip mounting area may be that portion of the upper surface 122 that may confront the semiconductor chip 110. That is, the semiconductor chip 110 may be superposed above the chip mounting area of the upper surface 122. Vias 127 may penetrate the base film 121. The dual metal layer 124 and 131 may include an upper metal layer 124 provided on the upper surface 122 of the base film 121, and a lower metal layer 131 provided on the lower surface 123 of the base film 121.

The upper metal layer 124 may be provided on the chip mounting area and may be connected to the electrode bumps 116. The upper metal layer 124 may extend outwards from the chip mounting area. The upper metal layer 124 may include input terminal patterns 125 and output terminal patterns 126, for example. By way of example only, the input terminal patterns 125 may extend to one side of the base film 121 relative to the semiconductor chip 110, and the output terminal patterns 126 may extend to another side of the base film 121 relative to the semiconductor chip 110. The input terminal patterns 125 may include ground terminal patterns 125a connected to the ground bumps 117a.

The lower metal layer 131 may be provided on a region of the lower surface 123 corresponding to the chip mounting area. For example, the chip mounting area may be superposed above the lower metal layer 131. The lower metal layer 131 may include a ground layer 132. The ground layer 132 may be connected to the ground terminal patterns 125a through the vias 127. By way of example only, the ground layer 132 may cover at least the chip mounting area. The ground layer 132 may be fabricated from a plate or a mesh, for example. The ground layer 132 may provide a sufficient ground area to reduce the dissipation of electromagnetic waves and/or noise that the semiconductor chip 110 may emit, thereby improving the electrical stability.

The vias 127 connecting the ground terminal patterns 125a to the ground layer 132 may reduce the need for separate wirings for connecting the ground terminal patterns 125a to the ground layer 132, and/or reduce the ground route length.

The upper metal layer 124 may be arranged on an outer peripheral region of the chip mounting area. In an example embodiment, the upper metal layer 124 may not cover a central portion of the chip mounting area. The arrangement of the upper metal layer 124 only on the peripheral region of the chip mounting area (and not on the central portion of the chip mounting area) may facilitate the flow of the molding compound 140 during an underfill process and/or decrease the likelihood of void generation.

The ground layer 132 may serve as a heat sink for radiating the heat which the semiconductor chip 110 may emit, for example. The dummy bumps 119 may be connected to the ground layer 132 to improve heat radiation characteristics, for example. The dummy bumps 119 may be connected to dummy terminal patterns 128 through dummy vias 134.

Figure 6:
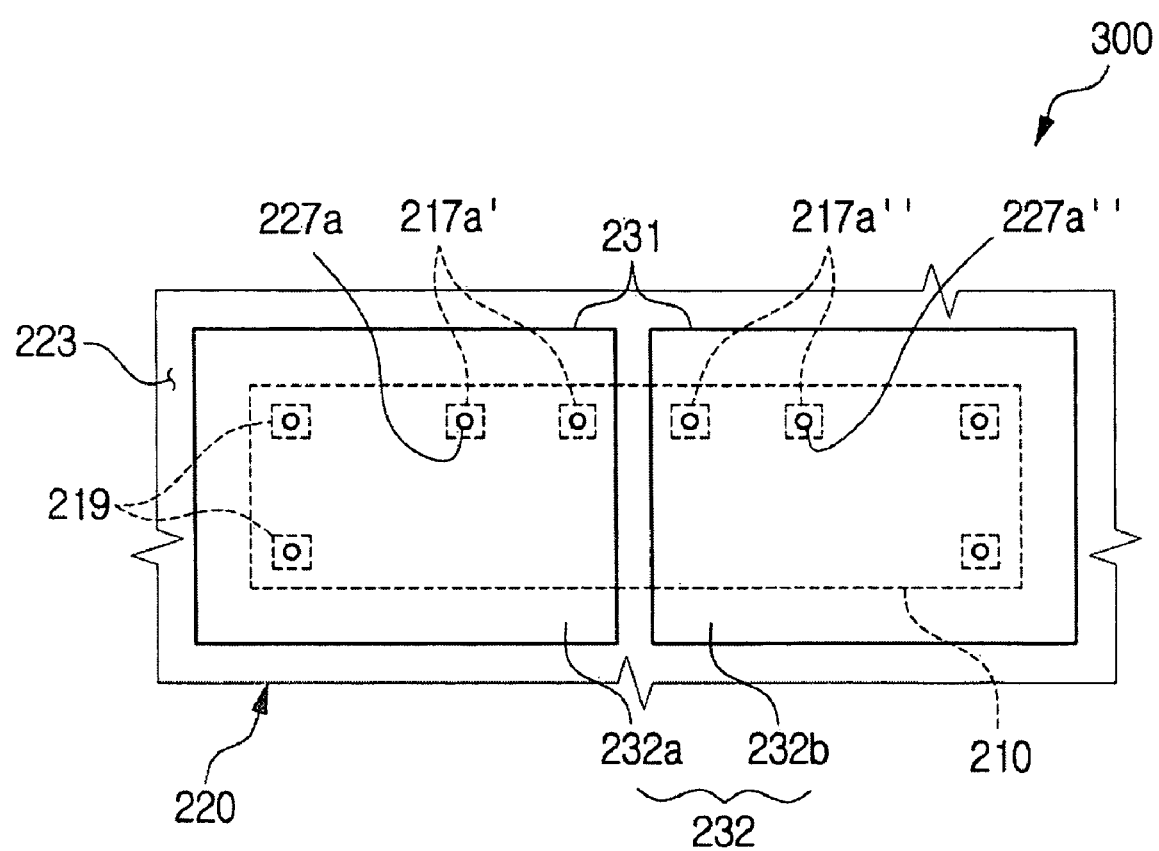
FIG. 6 is a bottom view of a COF package in accordance with another example, non-limiting embodiment of the present invention.

In this example embodiment, the ground layer 132 may be of an integral, one-piece construction. In alternative embodiments, the ground layer may be of a multi-piece construction. For example, referring to FIG. 6, a COF package 300 may include a tape wiring substrate 220 having a first ground layer 232a and a second ground layer 232b. First ground bumps 217a' may be connected to the first ground layer 232a through first vias 227a. Second ground bumps 217a" may be connected to the second ground layer 232b through second vias 227a".

By way of example only, the multi-piece ground layer 232 may be implemented when different voltages may be applied to a semiconductor chip 210. For example, when the semiconductor chip 210 has an analog circuit having an applied voltage of 5V and a digital circuit having an applied voltage of 1.5V, the ground layer may be separated into a ground layer for the analog circuit and a ground layer for the digital circuit.

In the above example embodiments, the base film may have the ground layer only. In alternative embodiments, the base film may have a ground layer and a power layer.

Figure 7:
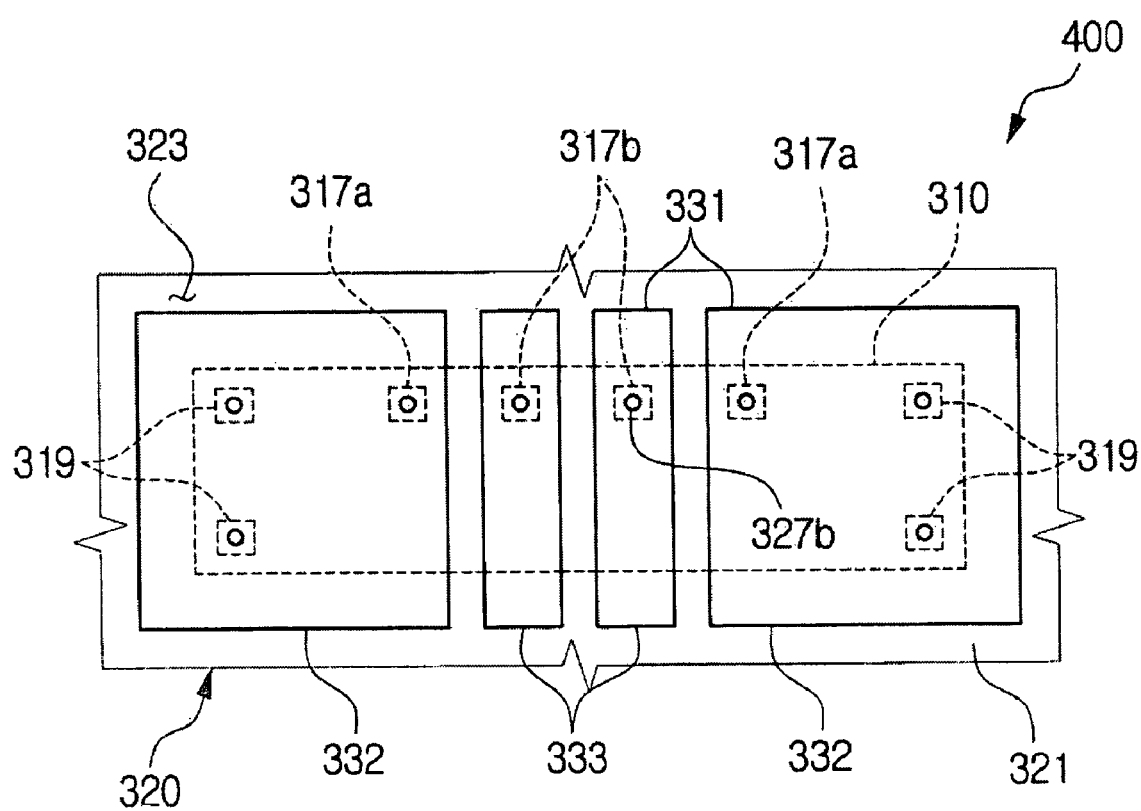
FIG. 7 is a bottom view of a COF package in accordance with another example, non-limiting embodiment of the present invention.

Referring to FIG. 7, a COF package 400 may have a lower metal layer 331 including ground layers 332 and power layers 333. The ground layers 332 may be separated from the power layers 333.

The power layers 333 may be arranged on a lower surface 323 of a base film 321, corresponding to a chip mounting area. Power terminal patterns (not shown) may be bonded to power bumps 317b. The power terminal patterns may be connected to the power layers 333 through vias 327b.

The vias 327b connecting the power bumps 317b to the power layer 333 may reduce the need for separate wirings for connecting the power bumps 317b to the power layer 333, and/or reduce the power route length.

By way of example only, the power layer 333 may be implemented when different voltages may be applied to a semiconductor chip 310. In this example embodiment, the power layers 333 may be provided between the ground layers 332.

The lower metal layer including ground layers and power layers may have various layouts according to the arrangement and voltage of ground bumps and power bumps of a semiconductor chip.

Figure 8:
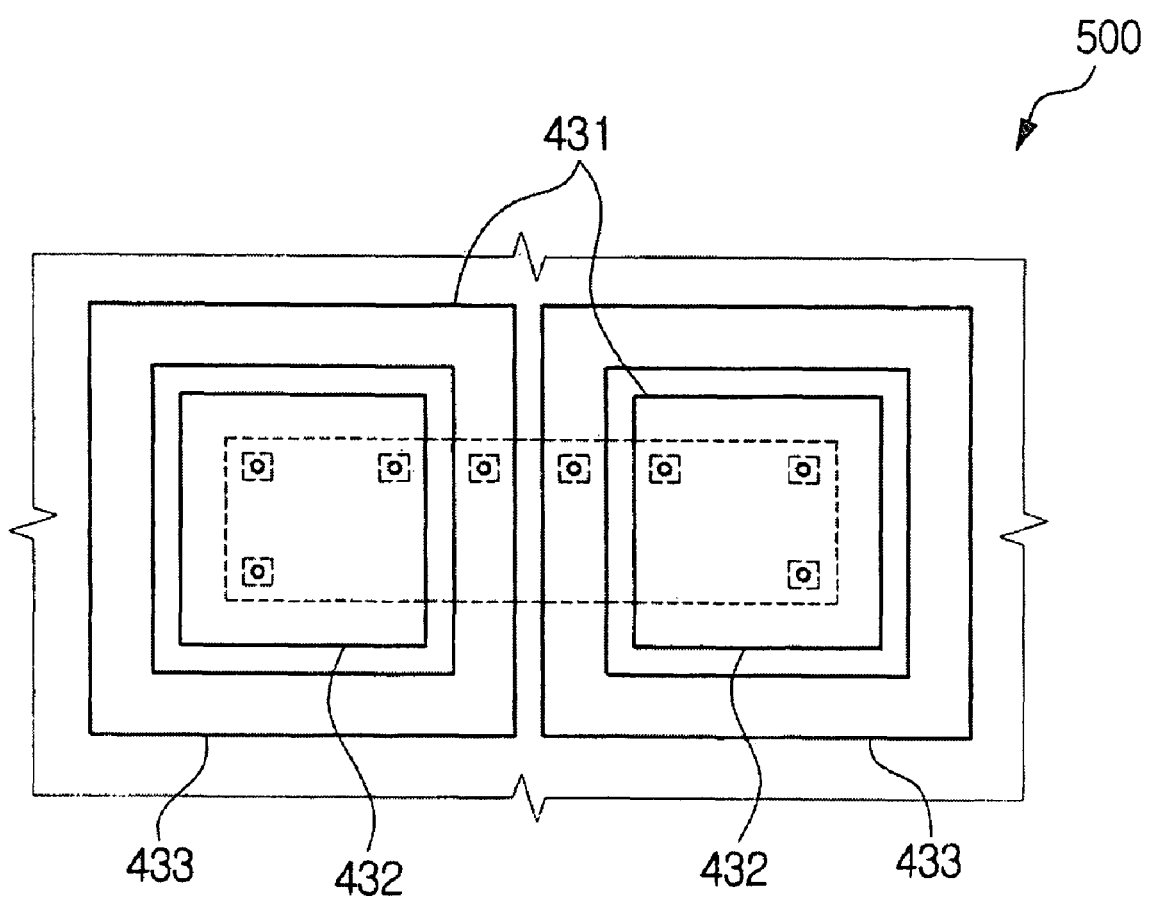
FIG. 8 is a bottom view of a COF package in accordance with another example, non-limiting embodiment of the present invention.

Referring to FIG. 8, a COF package 500 may have a lower metal layer 431 including ground layers 432 and power layers 433. The power layers 433 may have a ring shape enclosing the ground layer 432. In this example embodiment, the power layers 433 may have a square ring shape. In alternative embodiments, the power layers 433 may have an arcuate ring shape (e.g., a circular ring shape). Moreover, the spacing between the ground layers 432 and the power layers 433 may be uniform (as shown), or varied.

Figure 9:
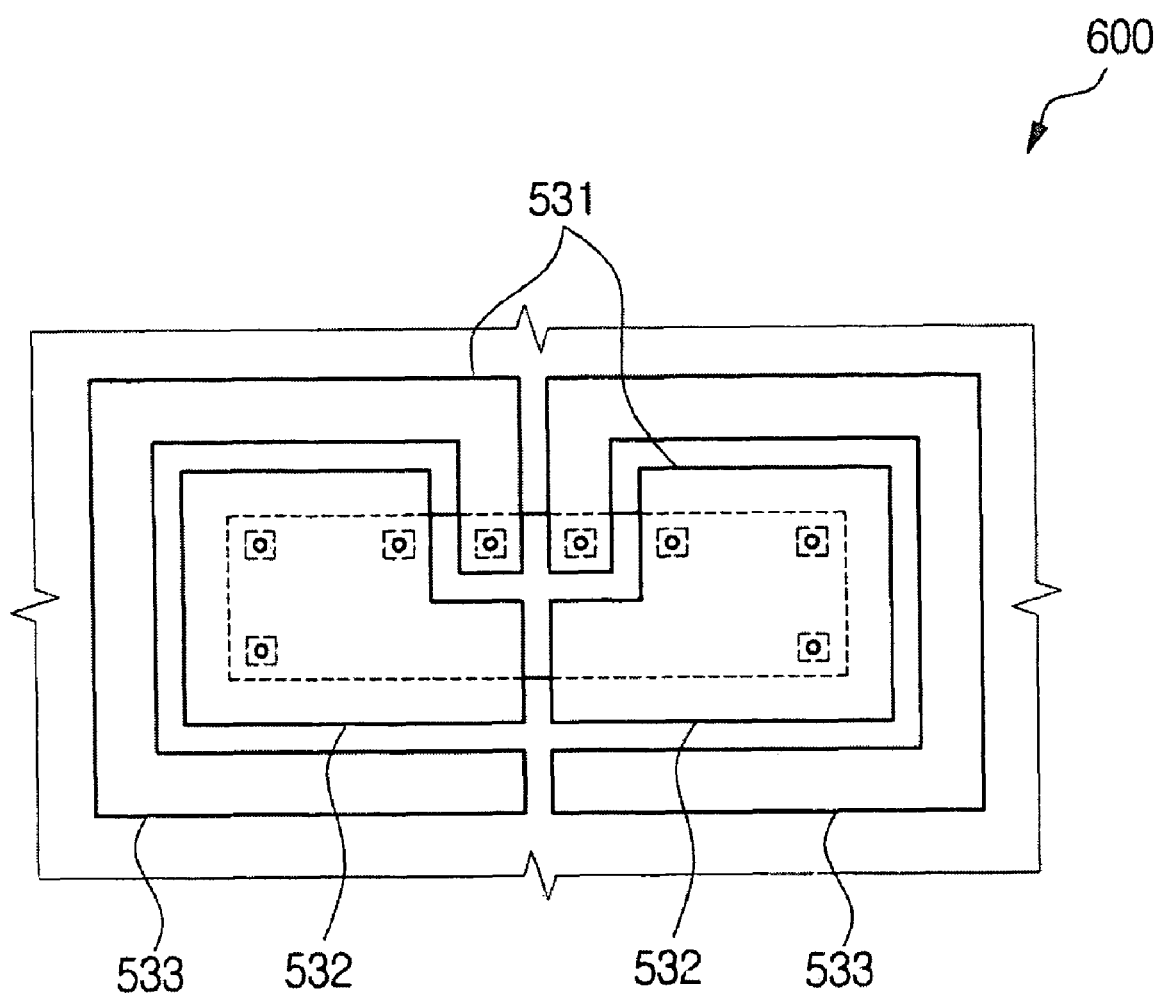
FIG. 9 is a bottom plan view of a COF package in accordance with another example, non-limiting embodiment of the present invention.

Referring to FIG. 9, a COF package 600 may have a lower metal layer 531 including ground layers 532 and power layers 533. The power layers 533 may have the shape of a letter "C." The power layers 533 may surround the ground layers 532.

Figure 10:
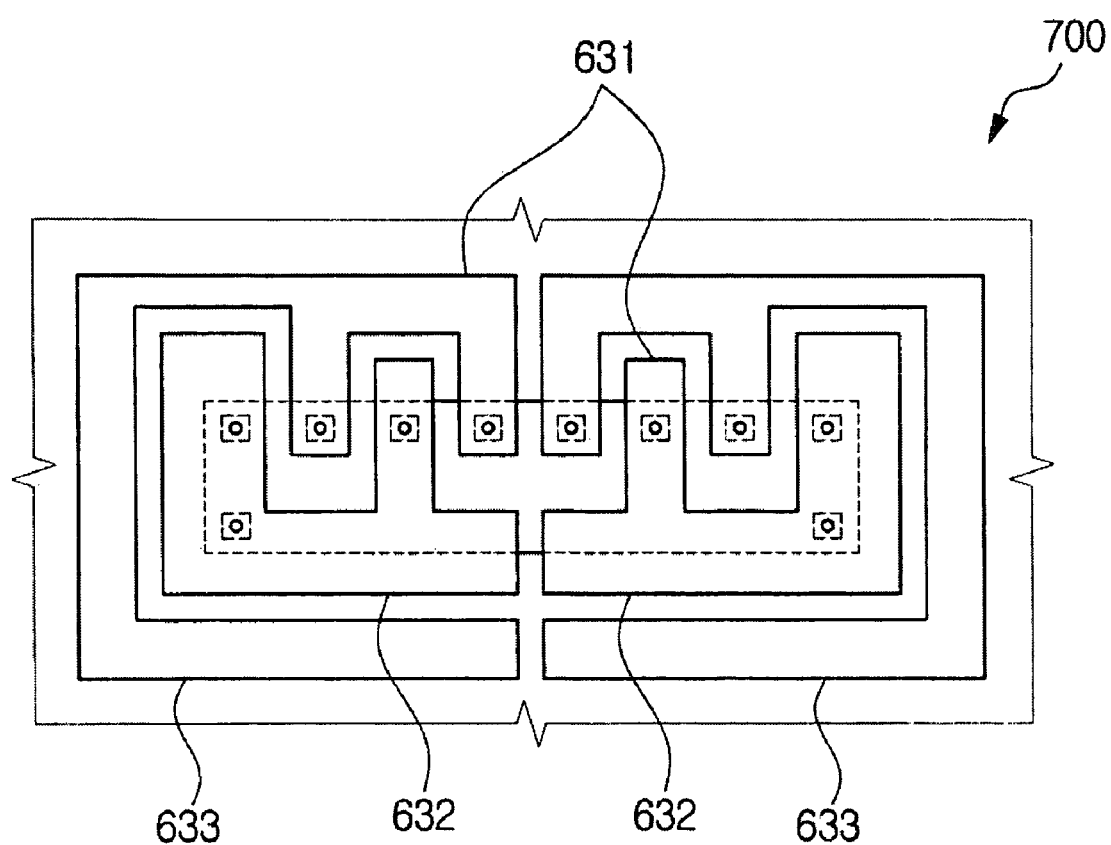
FIG. 10 is a bottom view of a COF package in accordance with another example, non-limiting embodiment of the present invention.

Referring to FIG. 10, a COF package 700 may have a lower metal layer 631 including ground layers 632 and power layers 633. The power layers 633 may have a comb shape. The power layers 633 may surround the ground layer 632.

Although the above example embodiments show the power layers may surround the ground layers, it will be appreciated that the ground layers may surround the power layers. Further, in the above example embodiments, the lower metal layer may have ground layers of the same shape and/or power layers of the same shape. In alternative embodiment, a given lower metal layer may have ground layers of different shapes and/or power layers of different shapes.

Although example, non-limiting embodiments of the present invention have been described in detail, it will be understood that many variations and/or modifications of the basic inventive concepts, which may appear to those skilled in the art, will still fall within the spirit and scope of the example embodiments of the present invention as defined in the appended claims.

What is claimed is:

1. A tape wiring substrate comprising:
   a film having an upper surface including a chip mounting area and a lower surface;
   an upper metal layer provided on the upper surface of the film and connected to electrode bumps of a semiconductor chip, the upper metal layer including input terminal patterns and output terminal patterns, wherein the upper metal layer extends outward from the chip mounting area;
   a lower metal layer provided on the lower surface of the film, the lower metal layer including a ground layer; and
   a via formed through the film and connected to the upper metal layer and the lower metal layer,
   wherein the ground layer covers at least the chip mounting area.

2. The substrate of claim 1, wherein the ground layer is separated into a plurality of ground layers.

3. The tape wiring system of claim 1, wherein the ground layer reduces at least one of electromagnetic radiation and noise.

4. The tape wiring system of claim 1, wherein the upper metal layer extends to one side of the film.

5. A tape wiring substrate comprising:
   a film having an upper surface including a chip mounting area and a lower surface;
   an upper metal layer provided on the upper surface of the film and connected to electrode bumps of a semiconductor chip, the upper metal layer including input terminal patterns and output terminal patterns, wherein the upper metal layer extends outward from the chip mounting area;

a lower metal layer provided on the lower surface of the film, the lower metal layer including a ground layer; and a via formed through the film and connected to the upper metal layer and the lower metal layer, wherein the ground layer overlaps the chip mounting area.

6. The tape wiring system of claim 5, wherein the ground layer reduces at least one of electromagnetic radiation and noise.

7. The tape wiring system of claim 5, wherein the upper metal layer extends to one side of the film.

8. A tape wiring substrate comprising:

a film having an upper surface including a chip mounting area and a lower surface;

an upper metal layer provided on the upper surface of the film and connected to electrode bumps of a semiconductor chip, the upper metal layer including input terminal patterns and output terminal patterns, wherein the upper metal layer extends outward from the chip mounting area;

a lower metal layer provided on the lower surface of the film, the lower metal layer including a ground layer; and a via formed through the film and connected to the upper metal layer and the lower metal layer, wherein the lower metal layer further comprises a power layer.

9. The substrate of claim 8, wherein the ground layer surrounds at least three sides of the power layer.

10. The substrate of claim 8, wherein the power layer is separated into a plurality of power layers.

11. A tape wiring substrate comprising:

a film having an upper surface including a chip mounting area and a lower surface;

an upper metal layer provided on the upper surface of the film and connected to electrode bumps of a semiconductor chip, the upper metal layer including input terminal patterns and output terminal patterns, wherein the upper metal layer extends outward from the chip mounting area;

a lower metal layer provided on the lower surface of the film, the lower metal layer including a ground layer; and a via formed through the film and connected to the upper metal layer and the lower metal layer, wherein a thickness of the lower metal layer is thicker than that of the upper metal layer.

12. A package comprising:

a semiconductor chip having an active surface with electrode bumps;

a tape wiring substrate on which the semiconductor chip is mounted such that the electrode bumps face the tape wiring substrate; and a molding compound provided between the semiconductor chip and the tape wiring substrate, the tape wiring substrate including:

a film having an upper surface including a chip mounting area and a lower surface;

an upper metal layer provided on the upper surface of the film and connected to electrode bumps of the semiconductor chip, the upper metal layer including input terminal patterns and output terminal patterns, wherein the upper metal layer extends outward from the chip mounting area;

a lower metal layer provided on the lower surface of the film, the lower metal layer including a ground layer; and a via provided through the film and connected to the upper metal layer and the lower metal layer, wherein the ground layer overlaps at least the chip mounting area.

13. The package of claim 12, wherein the ground layer is separated into a plurality of ground layers.

14. The package of claim 13, wherein at least two of the grounds layers are electrically connected to each other.

15. The package of claim 12, wherein the ground layer reduces at least one of electromagnetic radiation and noise.

16. The package of claim 12, wherein the upper metal layer extends to one side of the film.

17. A package comprising:

a semiconductor chip having an active surface with electrode bumps;

a tape wiring substrate on which the semiconductor chip is mounted such that the electrode bumps face the tape wiring substrate; and a molding compound provided between the semiconductor chip and the tape wiring substrate, the tape wiring substrate including:

a film having an upper surface including a chip mounting area and a lower surface;

an upper metal layer provided on the upper surface of the film and connected to electrode bumps of the semiconductor chip, the upper metal layer including input terminal patterns and output terminal patterns, wherein the upper metal layer extends outward from the chip mounting area;

a lower metal layer provided on the lower surface of the film, the lower metal layer including a ground layer; and a via provided through the film and connected to the upper metal layer and the lower metal layer, wherein the ground layer surrounds the chip mounting area.

18. The package of claim 17, wherein the ground layer reduces at least one of electromagnetic radiation and noise.

19. The package of claim 17, wherein the upper metal layer extends to one side of the film.

20. A package comprising:

a semiconductor chip having an active surface with electrode bumps;

a tape wiring substrate on which the semiconductor chip is mounted such that the electrode bumps face the tape wiring substrate; and a molding compound provided between the semiconductor chip and the tape wiring substrate, the tape wiring substrate including:

a film having an upper surface including a chip mounting area and a lower surface;

an upper metal layer provided on the upper surface of the film and connected to electrode bumps of the semiconductor chip, the upper metal layer including input terminal patterns and output terminal patterns, wherein the upper metal layer extends outward from the chip mounting area;

a lower metal layer provided on the lower surface of the film, the lower metal layer including a ground layer; and a via provided through the film and connected to the upper metal layer and the lower metal layer, wherein the lower metal layer further comprises a power layer.

21. The package of claim 20, wherein the ground layer surrounds at least three sides of the power layer.

22. The package of claim 20, wherein the power layer is separated into a plurality of power layers.

23. The package of claim 22, wherein at least two of the power layers are electrically connected to each other.

24. A package comprising:
a semiconductor chip having an active surface with electrode bumps;
a tape wiring substrate on which the semiconductor chip is mounted such that the electrode bumps face the tape wiring substrate; and
a molding compound provided between the semiconductor chip and the tape wiring substrate,
the tape wiring substrate including:
a film having an upper surface including a chip mounting area and a lower surface;
an upper metal layer provided on the upper surface of the film and connected to electrode bumps of the semiconductor chip, the upper metal layer including input terminal patterns and output terminal patterns, wherein the upper metal layer extends outward from the chip mounting area;
a lower metal layer provided on the lower surface of the film, the lower metal layer including a ground layer; and
a via provided through the film and connected to the upper metal layer and the lower metal layer,
wherein the electrode bumps including a first bump and a second bump, a size of the first bump is greater than a size of the second bump, wherein the first bump is connected to the via.

25. A package comprising:
a semiconductor chip having an active surface with electrode bumps;
a tape wiring substrate on which the semiconductor chip is mounted such that the electrode bumps face the tape wiring substrate; and
a molding compound provided between the semiconductor chip and the tape wiring substrate,
the tape wiring substrate including:
a film having an upper surface including a chip mounting area and a lower surface;
an upper metal layer provided on the upper surface of the film and connected to electrode bumps of the semiconductor chip, the upper metal layer including input terminal patterns and output terminal patterns, wherein the upper metal layer extends outward from the chip mounting area;
a lower metal layer provided on the lower surface of the film, the lower metal layer including a ground layer; and
a via provided through the film and connected to the upper metal layer and the lower metal layer,
wherein the first bump is disposed on the via.

26. A package comprising:
a semiconductor chip having an active surface with electrode bumps;
a tape wiring substrate on which the semiconductor chip is mounted such that the electrode bumps face the tape wiring substrate; and
a molding compound provided between the semiconductor chip and the tape wiring substrate,
the tape wiring substrate including:
a film having an upper surface including a chip mounting area and a lower surface;
an upper metal layer provided on the upper surface of the film and connected to electrode bumps of the semiconductor chip, the upper metal layer including input terminal patterns and output terminal patterns, wherein the upper metal layer extends outward from the chip mounting area;
a lower metal layer provided on the lower surface of the film, the lower metal layer including a ground layer; and
a via provided through the film and connected to the upper metal layer and the lower metal layer,
wherein a thickness of the lower metal layer is thicker than that of the upper metal layer.

* * * * *